(12) United States Patent
Ueki (10) Patent No.: US 7,340,962 B2
(45) Date of Patent: Mar. 11, 2008

(54) METHOD AND DEVICE FOR HOLDING SUBJECT AND MEASURING INSTRUMENT EQUIPPED WITH THE DEVICE

(75) Inventor: Nobuaki Ueki, Saitama (JP)

(73) Assignee: Fujinon Corporation, Saitama (JP)

( * ) Notice: Subject to any disclaimer, the term of this patent is extended or adjusted under 35 U.S.C. 154(b) by 133 days.

(21) Appl. No.: 11/256,956

(22) Filed: Oct. 25, 2005

(65) Prior Publication Data

US 2006/0086193 A1    Apr. 27, 2006

(30) Foreign Application Priority Data

Oct. 25, 2004    (JP)    .............................. 2004-309600

(51) Int. Cl.
*G01N 3/02*    (2006.01)
(52) U.S. Cl. .......................................... 73/856; 73/855
(58) Field of Classification Search .................. 73/855, 73/856
See application file for complete search history.

(56) References Cited

U.S. PATENT DOCUMENTS

| | | | |
|---|---|---|---|
| 5,995,226 A * | 11/1999 | Abe et al. .................... | 356/511 |
| 6,803,992 B2 * | 10/2004 | Tokuda et al. ................ | 355/53 |
| 6,885,436 B1 * | 4/2005 | Berman et al. ................ | 355/75 |
| 6,992,779 B2 * | 1/2006 | Ueki ........................... | 356/512 |
| 2004/0146789 A1 * | 7/2004 | Itoh .............................. | 430/5 |
| 2004/0192063 A1 * | 9/2004 | Koike ........................ | 438/736 |
| 2006/0126077 A1 * | 6/2006 | Ueki ........................... | 356/512 |
| 2007/0059608 A1 * | 3/2007 | Ikuta et al. .................... | 430/5 |

FOREIGN PATENT DOCUMENTS

| JP | 9-306832 | 11/1997 |
|---|---|---|
| JP | 2000-223414 | 8/2000 |

* cited by examiner

*Primary Examiner*—Edward Lefkowitz
*Assistant Examiner*—Freddie Kirkland, III
(74) *Attorney, Agent, or Firm*—Young & Thompson (57) ABSTRACT

A subject having a test surface is held by a holder so that an axis line of the test surface intersects the direction of gravity and applied with a load, from above and beneath, that is optimized for accurate measurement of surface profile of the test surface. For optimization of the load, the test surface is applied with variable exploratory load strong enough to cause bending deformation in the test surface and a linear-functional relationship existing between more than two different exploratory loads and sizes of surface deformation caused with the different exploratory loads is derived. With the aid of linear-functional relationship, a load that induces the subject to cause surface deformation less than a predetermined size of surface deformation admissible, for example, as a manufacturing en-or is used as an optimized load.

10 Claims, 5 Drawing Sheets

METHOD AND DEVICE FOR HOLDING SUBJECT AND MEASURING INSTRUMENT EQUIPPED WITH THE DEVICE

BACKGROUND OF THE INVENTION

Standing position/upright standing position

1. Field of the Invention

The present invention relates to a subject holding method and a subject holding device for holding a subject having a test surface such as an optical element in a stationary standing position with respect to a measuring system and a measuring instrument, such as an optical interference device, equipped with the subject holding device.

2. Description of Related Art

In semiconductors manufacturing techniques, it is typically to use photomasks for exposing semiconductor wafers in order to transfer a desired circuit pattern thereon. For the exposure of such a semiconductor wafer to a circuit pattern, it is quite usual to put a photomask so as to keep a mask surface in a substantially horizontal position during exposure, in other words, so as to hold the photomask in such a manner that an axis line (an ordinary line) of the mask surface is oriented in a direction of gravity. In order to transfer the circuit pattern precisely, the photomask should be carefully held for prevention of an occurrence of flexure of the mask surface due to external influence, for example, gravitational influence. Consequentially, there have been proposed a variety of techniques of maintaining surface flatness of photomasks during exposure of semiconductor wafer to a circuit pattern as known from, for example, Unexamined Japanese Patent Publication Nos. 9-306832 and 2000-223414.

On the other hand, there is a strong demand on the part of photomask manufacturer to measure optical properties, such as surface accuracy and a distribution of refractive index, of photomasks preferably without being affected by gravity.

For the purpose of preventing the photomask from being distorted by gravitational influence during the measurement of optical properties of the photomask, it is conceivably preferable that the photomask is held in an upright standing position, i.e. in a position in which a normal line of the mask surface is perpendicular to a direction of gravity. In this context, the photomask standing simply by itself is wonky and inept at measurement. It is essential for the measurement of mask surface that the photomask must be held in a stationary state under load during measurement.

It is, however, quite difficult to find an optimized load to be applied to the photomask Although it is obvious that the load must be large enough to maintain the photomask in a stationary standing position, if it is too large, the photomask encounters flexure large enough to lead to imprecise measurement of the mask surface. Heretofore, techniques for finding an optimized load for maintaining the photomask in a standing position without flexure have not yet put on a firm footing, and besides, operators have no alternative but to rely on their experience and skill in finding an optimized load It is hardly capable of meeting product diversification to determine an optimized load by such a rule of thumb acquired by skilled operators. Further, if the determination of an optimize load is improper, photomasks possibly cause surface deformation beyond the bounds of admissible production error, it can not be denied that photomask are possibly disqualified as acceptable products even while they are at acceptable surface quality levels.

SUMMARY OF THE INVENTION

It is therefore an object of the present invention to provide a subject holding method and a subject holding device for holding a subject having a test surface as a measuring object under an optimized load that has no adverse effect on measurements.

It is another object of the present invention to provide a subject holding method and a subject holding device for holding a subject having a test surface as a measuring object under an optimized load so as thereby to maintain the subject in a stationary standing position with sect to a measurement system. It is a further object of the present invention to provide a me g instrument equipped with a subject holding device for measurement of a surface profile of a subject.

The foregoing objects are achieved by a subject holding method comprises the steps of supporting a subject so as to put an axis line of a test surface of the subject approximately perpendicularly to a direction of gravity, applying different exploratory loads to the subject in the direction of gravity at least more than two times so that the subject causes different sizes of surface deformation in the test surface, deriving a linear-functional relationship existing between the exploratory loads and the surface deformation, determining an optimized load under which the subject causes surface deformation less than a predetermined size, and holding the subject under the optimized load.

The exploratory load may be applied to the subject in rotational asymmetric directions with respect to the axis line of the test surface. In this instance, the subject is fired from the optimized load once after measurement of a size of surface deformation and restored to the same after having been repositioned by a predetermined angle of turn around the axis line of the test surface. After performing these steps, a judgment as to whether the optimized load is suitably acceptable or not can be made by comparing the sizes of surface deformation before and after the repositioning of the subject The subject holding method is implemented by a subject holding device comprising supporting means for supporting the subject from opposite sides of an axis line of a test surface of the subject so as to put the axis line approximately perpendicularly to a direction of gravity, load generating means for generating different loads which are applied to the subject in the direction of gravity through the supporting means so that the subject cause different sizes of surface deformation in the test surface, optimized load deriving means for deriving a linear-functional relationship existing between the exploratory loads and the sizes of surface deformation for at least two different exploratory loads and determining an optimized load that makes the subject to cause surface deformation less than a predetermined size from the linear-functional relationship, and control means for controlling the load generating means to generate the optimized load derived from the linear-functional relationship.

The load generating means generates a load having a line of action that is perpendicular to an axis line of a measuring plane in which the test surface is positioned at a predetermined distance from the measuring plane in a direction of the axis line.

A surface profile measuring instrument equipped with the subject holding device for measuring a surface profile of a subject comprises the subject holding device and a surface profile measurement system that measures a surface profile of a test surface of a subject held by the subject holding device. The surface profile measurement system may comprise an interference optical system having a reference surface for forming an interference fringe pattern between surface wavefronts from the test surface and the reference surface and measuring a surface profile of the test surface on the basis of an optical image of the interference fringe pattern.

According to the subject holding method and device of the present invention, a subject is supported under an optimized load in a position wherein an axis line of a test surface of the subject is put perpendicularly to a direction of gravity, so as to be held in a stationary state. The optimized load is found from a linear-functional relationship existing between exploratory loads and surface deformation caused by the exploratory loads and, in particular, determined so that it acts on the subject to cause surface deformation less than a predetermined size of surface deformation admissible, for example, as a manufacturing error. Consequentially, the optimized load does not in any way have an adverse effect on measurements. Besides, it is prevented to invite a situation in which subjects at acceptable surface quality levels are disqualified resulting from inaccurate assessment of test surface due to an improper load acting on the subjects.

According to the According to the measuring instrument of the present invention, it is realized to perform measurement of surface profile of subjects with a high degree of accuracy.

BRIEF DESCRIPTION OF THE DRAWINGS

The foregoing and other objects and features of the present invention will be clearly understood from the following detailed description when reading with reference to the accompanying drawings, wherein the same reference signs have been used to denote same or similar parts throughout the drawings, and in which.

DETAILED DESCRIPTION OF THE PREFERRED EMBODIMENTS

In the following description, the term "an axis line of a test surface" as used hereinafter shall mean and refer to a normal line of a test surface when the test surface is flat or a normal line passing through a center of a test surface when the test surface is curved In particular, when the subject is an optical element, the term "axis line shall means and refer to an optical axis of the optical element.

Figure 1:
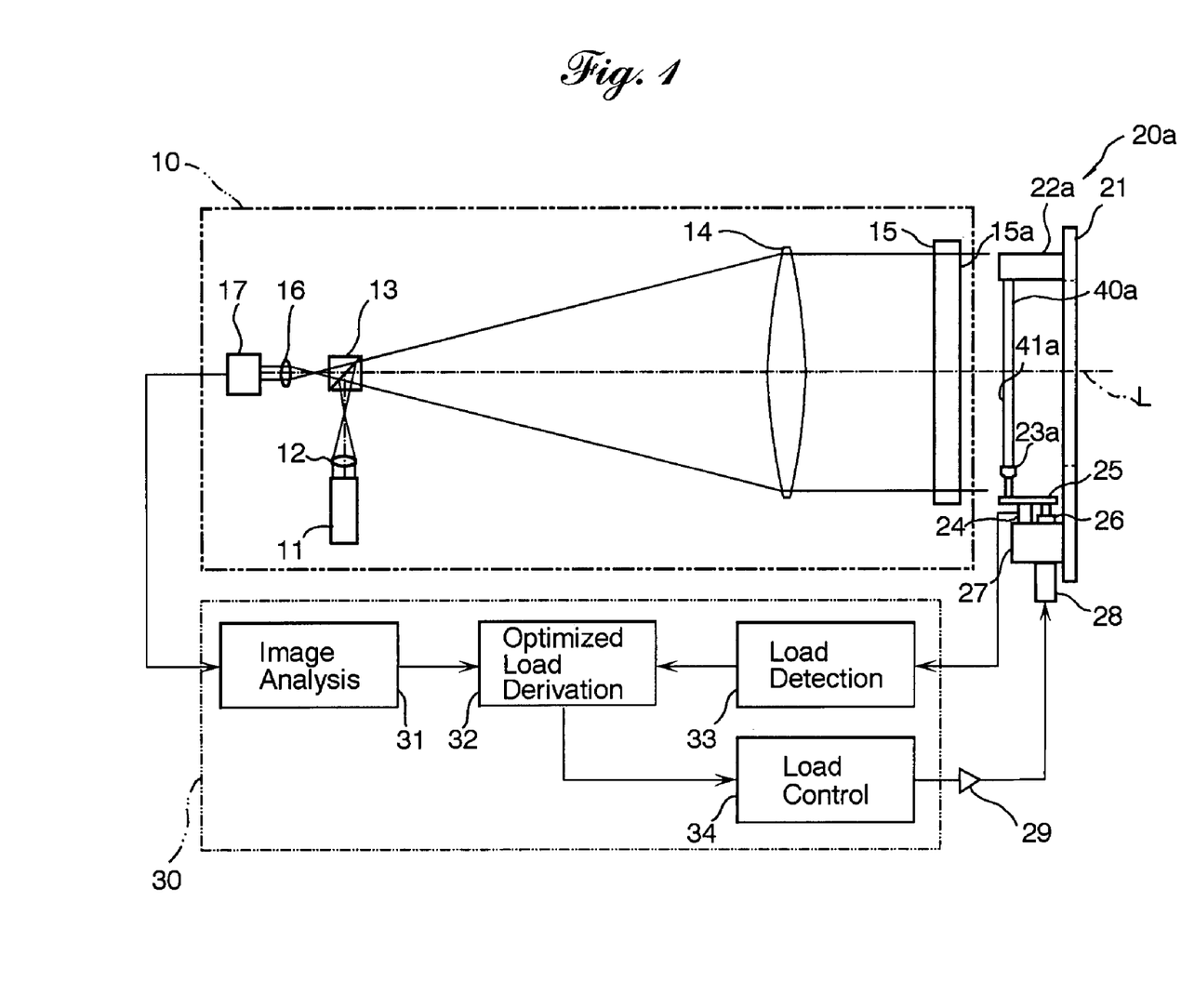
FIG. 1 is a schematic view illustrating a measuring instrument according to an embodiment of the present invention.

Referring to the accompanying drawings in detail, and in particular, to FIG. 1 showing a measuring instrument according to an embodiment of the present invention for use in measuring, for example, a surface profile, a distribution of internal refraction indices, or the like of a subject such as a photomask in a clean room. The measuring instrument comprises an interferometric optical system 10 equipped with a computerized analytic unit 30, a subject holding device 20a (shown in detail in FIGS. 2A and 2B) for holding a subject and the computer unit 30. The interferometric optical system 10 is known in various types and may take any well known type such as one of Fizeau type laser interferometers. Specifically, the interferometric optical system 10 comprises a laser source 11, an interference optical system 10 and an image sensor device 17 such as a CCD (Charge Coupled Device) or a CMOS (Complementary Metal-Oxide Semiconductor) device. The optical system comprises a magnifying lens 12, a beam splitter 13 for reflecting a laser beam from the laser source 11 at a right angle, a collimator lens 14 and a transparent reference plate 15, for example a glass plate, having a reference plane 15a arranged in order from the laser source 11 along an optical axis L. The optical system further comprises a focusing lens 16 arranged behind the beam splitter 13 on a side remote from the collimator lens 14 with respect to the beam splitter 13 so as to focus a laser beam passing through the beam splitter 13 onto the image sensor device 17. Although not shown in FIG. 1, the reference plate 15 is provided with a fringe scan adapter operative to cause axial micromotion of the reference plate 15 in a direction of the optical axis L during a fringe scan measurement.

The computer unit 30, that is made up of microprocessor, various memories, operation programs stored in the memories and other elements, includes functional blocks, namely at least an image analysis block 31 for analyzing a interference patter, an optimized load deriving block 32 for deriving a linear-functional relationship between a load and surface deformation and determining an optimized load to be applied to a subject based on the linear-functional relationship in a programmed analytic process, a load detection block 33 for detecting a load applied to a subject and a control block 34 for controlling the subject holding device 20a, in particular an actuator 28 of the subject holding device 20a. The computer unit 30 is connected to an external monitor (not shown) on which an image of interference pattern is displayed and a terminal device (not shown) through which various information are input into the computer unit 30.

Figure 2A:
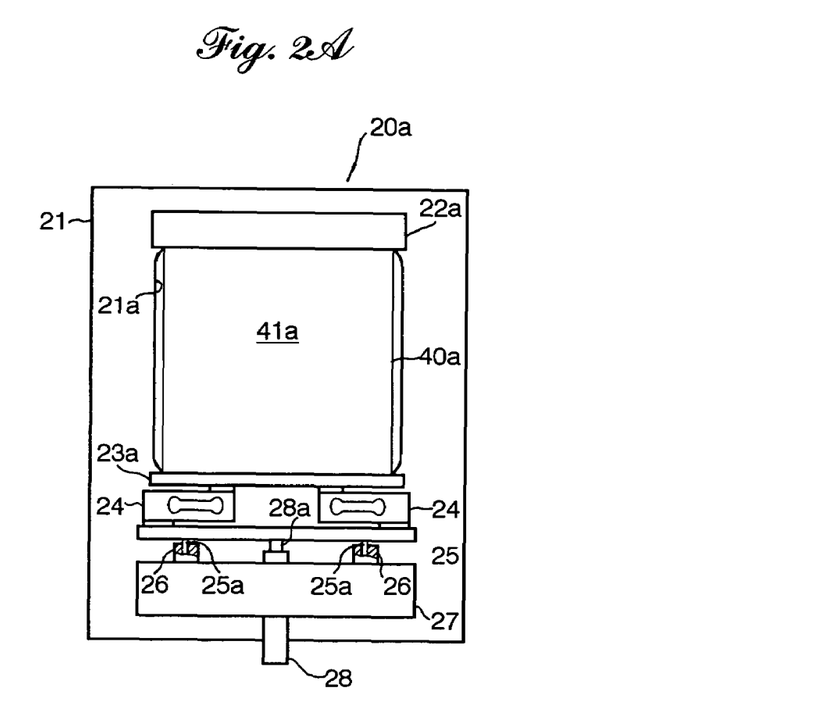
FIG. 2 is a schematic view of a holding device for holding a subject being measured according to an embodiment of the present invention.
Figure 2B:
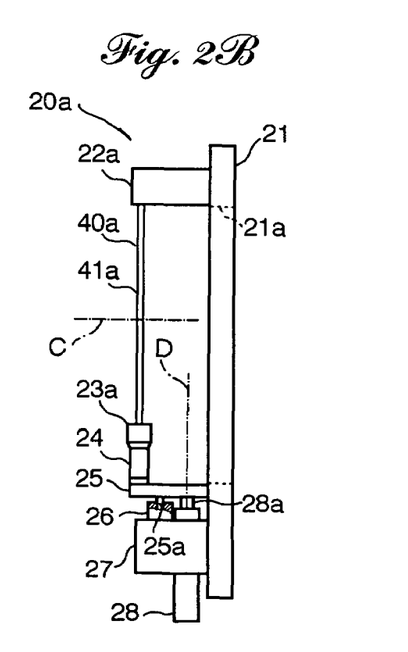

Referring to FIGS. 2A and 2B showing a subject holding device 20a in detail and a subject holding device according to an embodiment of the present invention, the subject holding device 20a comprises a backboard 21 having a square-shaped aperture 21a through which a surface wavefront of transmitted beam is monitored and a stationary table 27 secured thereto, stationary upper and movable lower jaws 22a and 23a having flat support faces, respectively, for nipping a subject 40a therebetween from above and beneath, a pair of load cells 24 for detecting loads acting on the subject 40a nipped between the upper and lower jaws 22a and 23a, and a load applying mechanism for applying a load to the subject 40a in rotational asymmetric directions with respect to an axis line C of a test surface (a center normal line of a test surface of a subject). The stationary upper jaw 22a is secured to the backboard 21 and, on the other hand, the movable lower jaw 23a is mounted on a movable table 25 (which will be described below) through the load cells 24. The load applying mechanism comprising the movable table 25 that is supported by a pair of guide blocks 26 mounted on the stationary table 27 so as to move up and down through guidance by linear guidepaths formed in the guide blocks 26, load generating means such as, for example, a linear actuator 28 mounted in the stationary table 27 that is connected to the movable table 25 through a plunger 28a thereof so as to generate a load, in particular a compressive load in this embodiment, to be applied to the subject 40a, and a regulator 29 for regulating a distance of protrusion of the plunger 28a which is connected between the control block 34 of the computer unit 30 and the linear actuator 28.

The stationary upper jaw 22a and the movable lower jaw 23a are formed so as to nip the subject 40a in such a manner that the axis line C is put perpendicularly to a direction of gravity (a direction from the top to the bottom of the drawing). Although not shown in FIGS. 2A and 2B, the upper and lower jaws 22a and 23a are provided with bracings for steadying front, rear and side surfaces of the subject 40a so as thereby to prevent the subject from inclining. Further, the upper and lower jaws 22a and 23a and their associated bracings are preferably made of a dust-free material such as polyether ether ketone (PEEK) or the like. The movable table 25 at an under side is provided with a pair of guide rods 25a. The guide blocks 26 snugly receive the guide rods 25a for sliding movement so as thereby to allow the movable table 25 to move up and down.

The linear actuator 28 causes up and down linear movement of the plunger 28a in a direction D that is collinear with the line of action of the plunger 28a as shown in FIG. 2B so as to push up and pull down the movable table 25. A apparent in FIG. 2B, the linear actuator 28 is positioned so that the line of action of the plunger 28 is separated by a specified distance from a plane in which the subject 40a is held between the upper and lower jaws 22a and 23a and intersects the axis line C at a substantially right angle. According to the load applying mechanism, when the actuator 28 is activated, the plunger 28a is forced upward to push the movable table 25 upward in the direction D, so as thereby to hold down the subject 40a against the upper jaw 22A through the load cells 24 and the lower jaw 23a. Consequently, the subject 40a receives a vertical compression stress and a bending moment to the subject 40a, thereby causing surface deformation due to bending in a test surface 41a thereof. At this time, the load cells 24 detect a vertical compression stress acting on the subject 40a and output a signal representing the load to the load detection block 33 of the computer unit 30. As perceivable in FIGS. 2A and 2B, the arrangement wherein the linear actuator 28 and the load cells 24 are located beneath the lower jaw 24 eliminates a possibility that the subject 40a is covered with dust flung due to motion of the linear actuator 28 and its associated parts at, in particular, the test surface 41a. Although not shown in FIGS. 2A and 2B, the subject holding device 20a is equipped with an inclination adjusting mechanism for adjusting an angle of inclination of a square-shaped subject 40a held thereby relative to the reference plate 15, in particular the reference surface 15a.

The following description will be directed to a practical sequential procedure of holding a subject 40a in the subject holding device 20a for use in combination with the interferometric 10 shown in FIG. 1.

Figure 3:
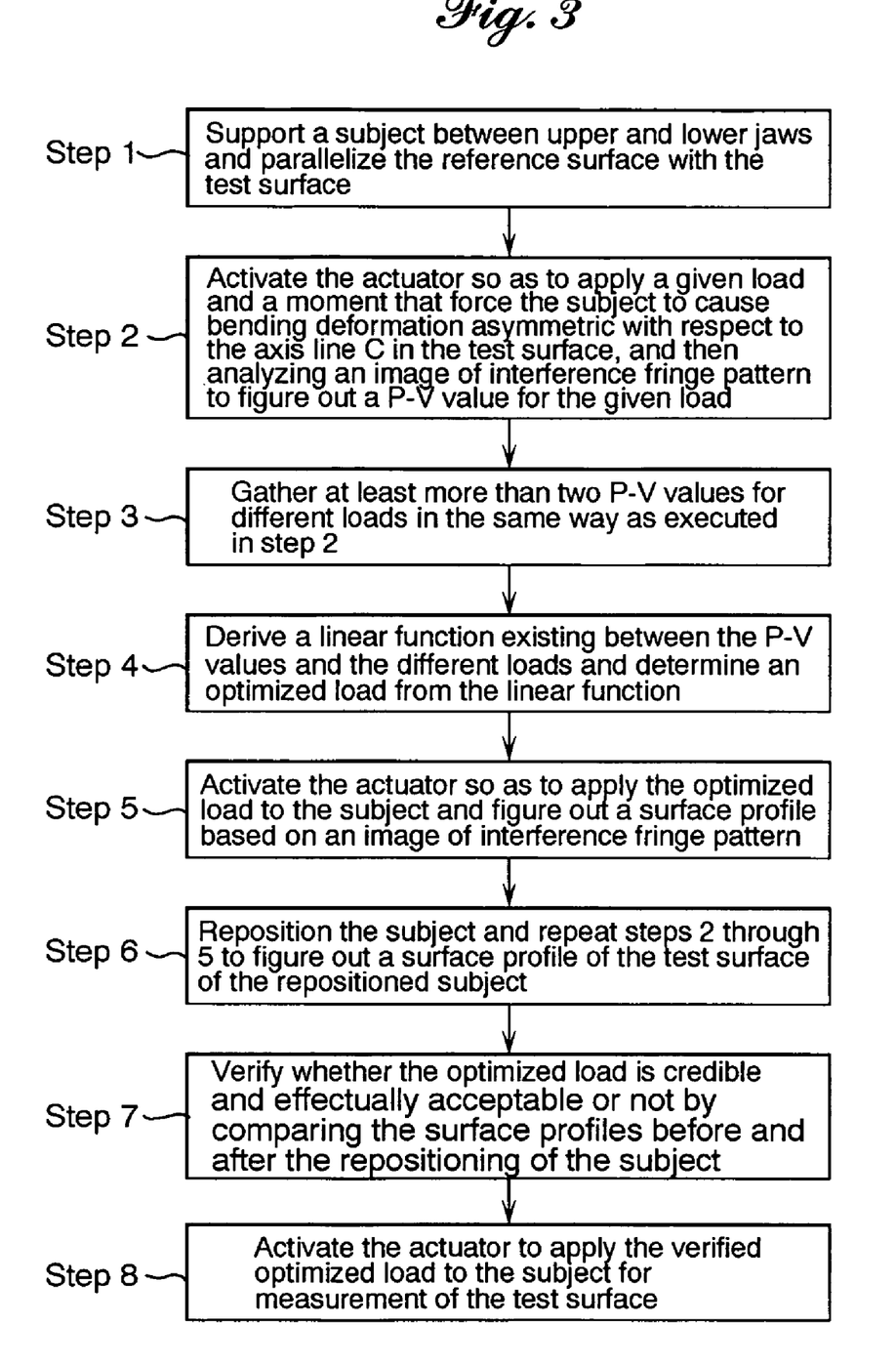
FIG. 3 is a chart illustrating a sequential procedure of holding a subject under an optimized load by the subject holding device.

FIG. 3 is a chart illustrating a sequential procedure of holding a subject 40a in the subject holding device 20a for use in combination with the interferometric measuring instrument shown in FIG. 1.

First of all, in a first step 1, a subject 40a such as a parallel plate having an axis line C (a center normal line) is put between the upper and lower jaws 22a and 23a with a test surface 41a facing the interferometric 10 so as to locate the axis line C intersects the direction of gravity at a substan-tially right angle. At this time, the inclination adjusting mechanism associated with the reference plate 15 is operated to adjust a position of the reference plate 15 so that the reference surface 15a is parallelized to the test surface 41a of the subject 40a. Subsequently, in step 2, the linear actuator 28 is activated to apply a given compressive load to the subject 40 though the upper and lower jaws 23a and 25 in rotational asymmetric directions with respect to the axis line C in such a way that the test surface 40a causes bending deformation asymmetrical with respect to the axis line C in the test surface 41a under the load and a moment In step S3, a size of surface deformation of the test surface 41a occurring resulting from the action of load on the subject 40a is found by analyzing an image of a fringe pattern with the use of the interferometer 10 provided with the computer unit 30. Specifically, a laser beam emanating from the laser source 11 and passing through the magnifying lens 12 is totally reflected at a right angel by the beam splitter 13 and then collimated by the collimator lens 14. The collimated rays enter the reference plate 15 and then partly reflect on the reference surface 15a of the reference plate 15 internally and partly pass through the reference plate 15. The reflected rays travel back passing through the collimator lens 14 as a reference beam. On the other hand, the collimated rays coming out of reference plate 15 impinge and reflect on the test surface 41a of the subject 40a. The reflected rays travel back passing through the collimator lens 14 as an object beam. These reference beam and object beam passing through the collimator lens 14 are integrated with and interfere with each other, thereby forming an interfered surface wavefront The integrated beam further travels back and totally passes through the beam splitter 13, and is then focused to for an optical image of fringe pattern representing a surface profile of the test surface 41a of the subject 40a on the image sensor device 17 by the focusing lens 16. The image sensor device 17 converts the image of fringe pattern into image data signals and sends them to the image analysis block 31 of the computer unit 30. The image analysis block 31 analyzes the image of fringe patter and finds a size of surface deformation of the test surface 41a of the subject 40a for the given load in programmed sequence. In this instance, a size of surface deformation is represented by an indicator such as a P-V value that is a measurement of an axial dance between an apex of a maximum concave deformation and a bottom of a convex deformation occurring in the test surface 41a. The measurement is performed varying a plunger protrusion distance, and hence the given load, linearly increasingly so as to find a predetermined number of P-V values as indictors of surface deformation for various loads. The load varying with a change in plunger protrusion distance is monitored by the load cells 24. In step 4, an optimized load is derived by the aid of linear-functional relationship, for example a linear function, in the optimized load deriving block 32. Specifically, first of all, a graphic representation of the measured P-V values (q) relative to the measured loads (p) is provided such as, for example, shown in FIG. 3(4) and formula size by drawing a straight lineation (shown by a broken line) approximated as congruous to a sequential line (shown by a solid line) of a graphic representation as possible as representing a linear function. In this instance, the linear function is derived from the straight lineation and expressed in the formula of $q(nm)=0.444p+137.38$.

Subsequently, load-free surface deformation is figured out by substituting 0 (zero) for p in the linear function. A solution is found as 137.38. Further, a difference of the load-free surface deformation from maximum surface deformation admissible, for example, as a manufacturing error is figured out For instance, in the case where the maximum allowable surface deformation is 142.38 nm in P-V value, the difference is 5 nm. An optimized load is then set to a load, for example 11.2 g, with which the test surface 41a causes a change in surface deformation from the load-free surface deformation less than 5 nm in P-V value.

Approximation of the linear function to the sequential line of the graphic representation between P-V values (q) and loads (p) is based on the following logic.

Figure 4:
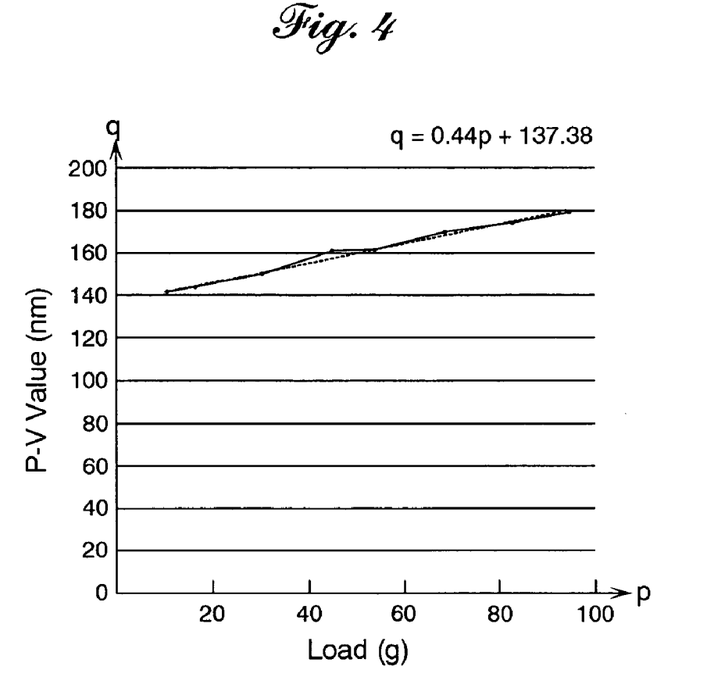
FIG. 4 is a graphic chart showing a process of determining an optimized load to be applied to the subject being measured.
Figure 5:
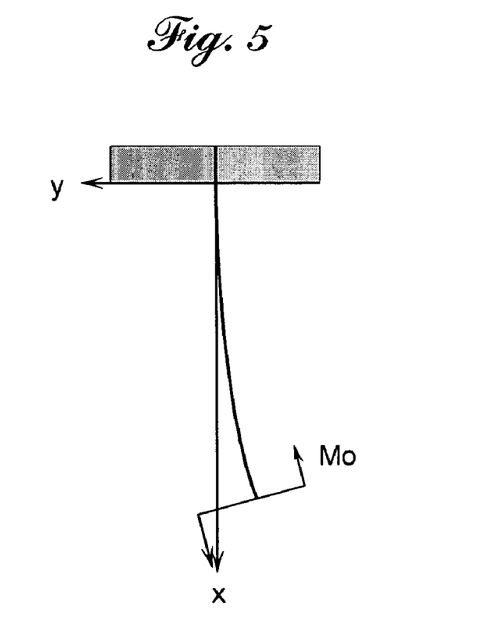
FIG. 5 is a schematic diagram showing a fundamental principle of determination of optimized load.

Referring to FIG. 4, when applying a load to a subject 40a in the direction D that is collinear with the line of action of the plunger 28a of the linear actuator 28 as shown in FIG. 2, a size of surface deformation of a test surface 41a of the subject 40a due to bending can be modeled after a pendent straight beam with a free end to which a bending moment Mo is applied. In a fixed x-y coordinate system on the deformation model, a size of deformation (y) is given by the following formula.

$$y = -M_o x^2 / (2EI)$$

where E and I are the Young's modulus and the geometric second moment of area of the subject As apparent from the formula, the size of bending deformation (y) is given by a linear function of moment (Mo). This indicates the fact that the subject 40a causes surface deformation (y) varies linear-functionally with respect to a load applied thereto.

In step 5, when the optimized load is derived as described above, the control block 34 provides a command signal representative of the optimized load to activate the linear actuator 28 to protrude the plunger 28a so as to apply the optimized load to the subject 40a through the upper and lower jaws 22a and 23a. A surface profile of the test surface 41a of the subject 40a is measured on the basis of an image of a fringe pattern with the use of the interferometer 10 provided with the computer unit 30 while it is held between the upper and lower jaws 22a and 23a under the optimized load.

Thereafter, in step 6, the linear actuator 28 is deactivated to retract the plunger so as thereby to free the subject 40a from constriction with the upper and lower jaws 22a and 23a and then reactivated to protrude the plunger 28a so as thereby to apply the optimized load to the subject 40a through the upper and lower jaws 22a and 23a after turning the subject 40a substantially 90 degrees in position around the axis line C. Then, the same measurement of surface profile of the test surface 41a of the subject 40a is executed while the subject 40a is held under the optimized load. In step 7, a verification test as to whether the optimized load is credible is conducted by comparative analysis of the surface profiles of the test surface 41a of the subject 40a held in the two different positions, for example, in the following way.

Coordinate transformation is performed for data of the surface profile of the test surface 41a after the repositioning of the subject 40a by turning the coordinate axes of the system of measurement 90 degrees. The data of the surface profiles of the surface 41a before and after the coordinate transformation are compared in order to find a finite difference between them. The optimized load is verified to be credible and effectually acceptable when the difference is less than a predetermined maximum difference, i.e. a predetermined verification tolerance, or to be incredible and unacceptable when the difference is beyond the predetermined verification tolerance.

Finally, in step 8, when the optimized load is effectually acceptable, the control block 34 provides a command signal representative of the verified optimized load to activate the linear actuator 28 to apply the optimized load to the subject 40a through the protrude-the plunger 28a, so as thereby to hold the subject 40 in a stationary standing position between the upper and lower jaws 22a and 23a. The subject 40a held by the subject holding device 20a under the optimized load is put in condition for accurate measurement of optical properties of the test surface 41a of the subject 40a by the use of the interferometric measuring instrument equipped with the computer unit 30.

In the sequence of holding a subject 40a in the subject holding device 20a described above, the credibility verification test in step 7 nay be left out of the sequential procedures.

Figure 6:
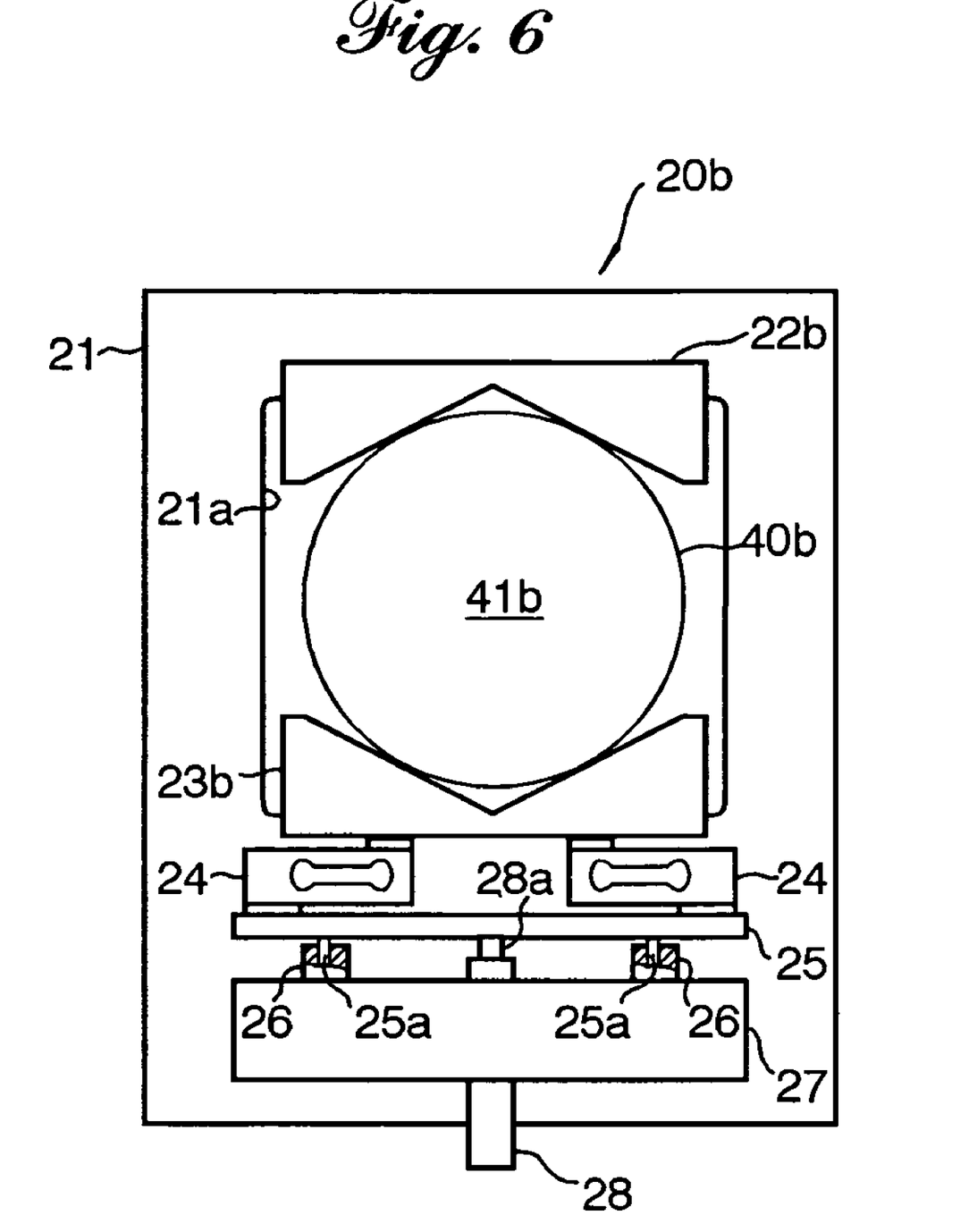
FIG. 6 is a schematic view of an alternative holding device for holding a subject being measured.

FIG. 6 shows a subject holding device 20b according to an alternative embodiment in which the same parts or mechanisms of the subject holding device as those of the previous embodiment are denoted by the same reference numerals and not described for simplicity. As shown in FIG. 6, the subject holding device 20b is structured suitably for a round subject such as an optical lens element 40b having a test surface 41b. Specifically, the subject holding device 20b has upper and lower stationary upper and movable lower jaws 22b and 23b. The upper jaw 22b has an inverted V-shaped support face, and the lower jaws 23a has a V-shaped support face for nipping the subject 40b therebetween from above and beneath According to the subject holding device 20b, the subject 40b is tightly and snugly held between the upper and lower jaws 22b and 23b. These upper and lower jaws 22B and 23B may be prepared as replaceable parts for the upper and lower jaws 22a and 23a of the subject holding device 20a shown in FIGS. 2A and 2B.

In any embodiments described above, the load applied to the subject may be a load causing tensile deformation in a test surface.

Although the above description is directed to the Fizeau type laser interferometer, the subject holding method and device are implemented in combination with various types of interferometric including a Michelson type interferometers, an inclined axis type interferometers and the like or with various types of surface profile measuring instruments including moire topographic measuring instruments, light-section type surface profile measuring instruments, etc.

It is to be understood that although the present invention has been described with regard to preferred embodiments thereof various other embodiments and variants may occur to those skilled in the art, which are within the scope and spirit of the invention, and such other embodiments and variants are intended to be covered by the following claims.

What is claimed is:

1. A subject holding method for holding a subject under an optimized load comprising the steps of:
   supporting a subject so as to put an axis line of a test surface of said subject to be tested approximately perpendicularly to a direction of gravity;
   applying different exploratory loads to said subject in said direction of gravity at least more than two times so that said subject causes different sizes of surface deformation in said test surface;
   deriving a linear-functional relationship existing between said exploratory loads and said surface deformation;
   determining an optimized load under which said subject causes said surface deformation less than a predetermined size; and
   holding said subject under said optimized load.

2. A surface profile measuring instrument for measuring a surface profile of a subject comprising a subject holding device as defined in claim 1 and a surface profile measurement system that measures a surface profile of a test surface of a subject held by said subject holding device.

3. The surface profile measuring instrument as defined in claim 2, wherein said surface profile measurement system comprises an interference optical system having a reference surface for measuring a surface profile of said test surface on the basis of an optical image of interference fringe pattern between surface wavefronts of light reflected by said test surface and said reference surface.

4. A subject holding method for holding a subject under an optimized load comprising the steps of:
   supporting a subject so as to put an axis line of a test surface of said subject to be tested approximately perpendicularly to a direction of gravity;
   applying different exploratory loads to said subject in said direction of gravity at least more than two times so that said subject causes different sizes of surface deformation in said test surface;
   deriving a linear-functional relationship existing between said exploratory loads and said surface deformation;
   determining an optimized load under which said subject causes said surface deformation less than a predetermined size; and
   holding said subject under said optimized load,
   wherein said exploratory load is applied in rotational asymmetric directions with respect to said axis line of said test surface.

5. A surface profile measuring instrument for measuring a surface profile of a subject comprising a subject holding device as defined in claim 4 and a surface profile measurement system that measures a surface profile of a test surface of a subject held by said subject holding device.

6. A subject holding method for holding a subject under an optimized load comprising the steps of:
   supporting a subject so as to put an axis line of a test surface of said subject to be tested approximately perpendicularly to a direction of gravity;
   applying different exploratory loads to said subject in said direction of gravity at least more than two times so that said subject causes different sizes of surface deformation in said test surface;
   deriving a linear-functional relationship existing between said exploratory loads and said surface deformation;
   determining an optimized load under which said subject causes said surface deformation less than a predetermined size;
   holding said subject under said optimized load;
   freeing said subject from said optimized load after measurement of a size of said surface deformation;
   holding said subject under said optimized load after having replaced said subject a predetermined angle of turn around said axis line of said test surface; and
   comparing said sizes of said surface deformation before and after said repositioning of said subject with each other for verification of acceptability of said optimized load.

7. A surface profile measuring instrument for measuring a surface profile of a subject comprising a subject holding device as defined in claim 6 and a surface profile measurement system that measures a surface profile of a test surface of a subject held by said subject holding device.

8. A subject holding device for holding a subject for measurement of a surface deformation, said subject holding device comprising:
   supporting means for supporting a subject from opposite sides of an axis line of a test surface of said subject so as to put said axis line approximately perpendicularly to a direction of gravity;
   load generating means for generating different exploratory loads which are applied to said subject in said direction of gravity through said supporting means so that said subject cause different sizes of surface deformation in said test surface;
   optimized load deriving means for determining a linear-functional relationship existing between said exploratory loads and said sizes of surface deformation for at least two said exploratory loads and finding an optimized load that makes said subject to cause surface deformation less than a predetermined size from said linear-functional relationship; and
   control means for controlling said load generating means to generate said optimized load.

9. The subject holding device as defined in claim 8, wherein said load generating means generates a load having a line of action that is perpendicular to said axis line of said test surface at a predetermined distance from a plane in which said test surface is positioned in a direction of said axis line.

10. The subject holding device as defined in claim 8, wherein said load generating means applies the exploratory loads in rotational asymmetric directions with respect to said axis line of said test surface.

* * * * *